(12) United States Patent
Koo et al.

(10) Patent No.: US 7,279,714 B2
(45) Date of Patent: Oct. 9, 2007

(54) FLAT PANEL DISPLAY DEVICE

(75) Inventors: Jae-Bon Koo, Suwon-si (KR); Min-Chul Suh, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/187,873

(22) Filed: Jul. 25, 2005

(65) Prior Publication Data
US 2006/0108916 A1    May 25, 2006

(30) Foreign Application Priority Data
Aug. 6, 2004    (KR) .................... 10-2004-0061947

(51) Int. Cl.
*H01L 29/04* (2006.01)
(52) U.S. Cl. .............. 257/72; 257/59; 257/E27.131
(58) Field of Classification Search ............ 257/59, 257/72, 83, 350, E33.064, E25.029, 40, 368, 257/351, E27.131, E27.132, E29.117; 427/69; 346/76; 349/38, 42, 43
See application file for complete search history.

(56) References Cited

U.S. PATENT DOCUMENTS

| | | | | |
|---|---|---|---|---|
| 6,150,668 A | * | 11/2000 | Bao et al. ............... | 257/40 |
| 7,038,278 B2 | * | 5/2006 | Tsujimura et al. ........ | 257/350 |
| 7,068,246 B2 | * | 6/2006 | Yamazaki et al. ......... | 345/76 |
| 2003/0222315 A1 | * | 12/2003 | Amundson et al. ....... | 257/368 |
| 2005/0053720 A1 | * | 3/2005 | Yamazaki et al. ......... | 427/69 |
| 2006/0145140 A1 | * | 7/2006 | Fix et al. .................. | 257/40 |

FOREIGN PATENT DOCUMENTS

| | | |
|---|---|---|
| JP | 2002-141511 | 5/2002 |
| JP | 2003-76299 | 3/2003 |

* cited by examiner

*Primary Examiner*—Evan Pert
*Assistant Examiner*—Benjamin Tzu-Hung Liu
(74) *Attorney, Agent, or Firm*—Robert E. Bushnell, Esq.

(57) ABSTRACT

A flat panel display device has a transistor in which crosstalk is minimized. The flat panel display device includes a substrate, a first gate electrode formed on the substrate, a first electrode insulated from the first gate electrode, a second electrode insulated from the first gate electrode and surrounding the first electrode in the same plane, a semiconductor layer insulated from the first gate electrode and contacting the first electrode and the second electrode, and a display element including a pixel electrode electrically connected to one of the first electrode and the second electrode.

17 Claims, 10 Drawing Sheets

FLAT PANEL DISPLAY DEVICE

CLAIM OF PRIORITY

This application makes reference to, incorporates the same herein, and claims all benefits accruing under 35 U.S.C. §119 from an application for FLAT PANEL DISPLAY DEVICE earlier filed in the Korean Intellectual Property Office on 6 Aug. 2004 and there duly assigned Serial No. 10-2004-0061947.

BACKGROUND OF THE INVENTION

1. Field of the Invention

The present invention relates to a flat panel display device, and more particularly, to a flat panel display device having a transistor in which cross-talk is minimized.

2. Description of the Related Art

A conventional inverted coplanar thin film transistor (TFT), includes gate electrodes being formed on a substrate, source electrodes and drain electrodes being formed above the gate electrodes, respectively, and a gate insulating layer being interposed between the source electrode and the gate electrode, between the drain electrode and the gate electrode, between the source electrode and the gate electrode, and between the drain electrode and the gate electrode. A semiconductor layer contacts the source electrodes and the drain electrodes. The source electrodes and the drain electrodes may be interchanged.

In the above structure, the semiconductor layer is not patterned but is formed as a single body for two adjacent thin film transistors (TFTs). In this case, cross-talk in which adjacent TFTs affect one another due to a leakage current, etc. may occur. Thus, in order to prevent cross-talk from occurring, the semiconductor layer should be patterned to be separately used by each TFT. However, in the case of an organic TFT using an organic semiconductor layer as the semiconductor layer, it is very difficult to pattern the semiconductor layer, and even if the organic semiconductor layer is patterned, electrical characteristics of the organic semiconductor layer are degraded.

SUMMARY OF THE INVENTION

It is therefore, an object of the present invention to provide a flat panel display device having a transistor in which cross-talk is minimized.

It is another object of the present invention to provide a flat panel display device having a transistor that has a structure with connections being more simplified, better quality and more secure.

It is still another object of the present invention to provide a flat panel display device having a transistor that has a structure that is easy to implement, more efficient and yet avoids interference.

According to an aspect of the present invention, there is provided a flat panel display device, the flat panel display device including a substrate; a first gate electrode formed on the substrate; a first electrode insulated from the first gate electrode; a second electrode insulated from the first gate electrode and surrounding the first electrode in the same plane; a semiconductor layer insulated from the first gate electrode and contacting the first electrode and the second electrode; and a display element including a pixel electrode electrically connected to one of the first electrode and the second electrode.

The first electrode and the second electrode may be formed above the first gate electrode.

The first gate electrode may be disposed above or below a space between the first electrode and the second electrode.

The first electrode may be a first drain electrode, the second electrode may be a first source electrode, and the first electrode may be connected to the pixel electrode.

The flat panel display device may further include a first capacitor electrode connected to the first gate electrode; and a second capacitor electrode connected to the second electrode.

The first capacitor electrode and the first gate electrode may be formed as a single body, and the second capacitor electrode and the second electrode may be formed as a single body.

The flat panel display device may further include a second gate electrode; a third electrode insulated from the second gate electrode; a fourth electrode insulated from the second gate electrode and surrounding the third electrode; and a semiconductor layer insulated from the second gate electrode and contacting the third electrode and the fourth electrode, wherein one of the third electrode and the fourth electrode may be electrically connected to the first gate electrode.

The third electrode and the fourth electrode may be formed above the second gate electrode.

The second gate electrode may be disposed above or below a space between the third electrode and the fourth electrode.

The third electrode may be a second drain electrode, the fourth electrode may be a second source electrode, and the third electrode may be connected to the first gate electrode.

The flat panel display device may further include a gate insulating layer formed on the entire surface of the substrate and covering the first gate electrode, the second gate electrode, and the first capacitor electrode; and a protective layer formed on the entire surface of the substrate and covering the first through fourth electrodes, the second capacitor electrode, and the semiconductor layer.

The semiconductor layer may be formed on the first through fourth electrodes, a first contact hole may be formed in the protective layer and the semiconductor layer to expose a portion of the third electrode, a second contact hole may be formed in the protective layer, the semiconductor layer, and the gate insulating layer to expose a portion of the first capacitor electrode, and the third electrode and the first capacitor electrode may be connected to each other by an interconnection, formed in the first contact hole and the second contract hole and on the protective layer.

The interconnection connecting the third electrode to the first capacitor electrode may further include a metallic layer, which is connected to the first capacitor electrode via the second contact hole and formed of the same material as the fourth electrode, and formed on the gate insulating layer.

The first through fourth electrodes may be formed on the semiconductor layer, a first contact hole is formed in the protective layer to expose a portion of the third electrode, a second contact hole may be formed on the protective layer, the semiconductor layer, and the gate insulating layer to expose a portion of the first capacitor electrode, and the third electrode and the first capacitor electrode may be connected to each other by an interconnection, formed in the first contact hole and the second contract hole, and on the protective layer.

The interconnection connecting the third electrode to the first capacitor electrode may further include a metallic layer, which is connected to the first capacitor electrode via the second contact hole and formed of the same material as the fourth electrode, and formed on the semiconductor layer.

The pixel electrode may be formed on the protective layer, and the interconnection connecting the third electrode to the first capacitor electrode may be formed of the same material as the pixel electrode.

The pixel electrode may be formed on the protective layer, and the interconnection connecting the third electrode to the first capacitor electrode may be formed of the same material as the pixel electrode.

The third electrode may be a second source electrode, the fourth electrode may be a second drain electrode, and the fourth electrode may be electrically connected to the first gate electrode.

The flat panel display device may further include a protective layer formed on the entire surface of the substrate and covering the first gate electrode, the second gate electrode, the first through fourth electrodes, the first capacitor electrode, the second capacitor electrode, and the semiconductor layer, wherein the pixel electrode may be formed on the protective layer.

The flat panel display device may further include a second gate electrode; a third electrode insulated from the second gate electrode; a fourth electrode insulated from the second gate electrode and surrounding the third electrode; and a semiconductor layer insulated from the second gate electrode and contacting the third electrode and the fourth electrode, wherein one of the third electrode and the fourth electrode may be electrically connected to the first gate electrode.

The third electrode and the fourth electrode may be formed above the second gate electrode.

The second gate electrode may be disposed above or below a space between the third electrode and the fourth electrode.

The third electrode may be a second drain electrode, the fourth electrode may be a second source electrode, and the third electrode may be electrically connected to the first gate electrode.

The third electrode may be a second source electrode, the fourth electrode may be a second drain electrode, and the fourth electrode may be electrically connected to the first gate electrode.

The semiconductor layer may be an organic semiconductor layer.

Light generated in the display element may be emitted away from the substrate.

The display element may be an electroluminescence element.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
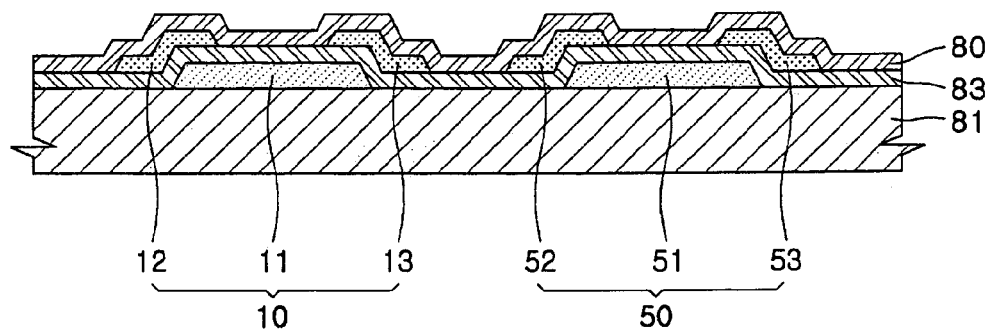
FIG. 1 is a schematic cross-sectional view of a conventional inverted coplanar thin film transistor (TFT)

Turning now to the drawings, FIG. 1 is a schematic cross-sectional view of a conventional inverted coplanar thin film transistor (TFT). Referring to FIG. 1, gate electrodes 11 and 51 are formed on a substrate 81, source electrodes 12 and 52 and drain electrodes 13 and 53 are formed above the gate electrodes 11 and 51, respectively, and a gate insulating layer 83 is interposed between the source electrode 12 and the gate electrode 11, between the drain electrode 13 and the gate electrode 11, between the source electrode 52 and the gate electrode 51, and between the drain electrode 53 and the gate electrode 51. A semiconductor layer 80 contacts the source electrodes 12 and 52 and the drain electrodes 13 and 53. The source electrodes 12 and 52 and the drain electrodes 13 and 53 may be interchanged.

In the above structure, the semiconductor layer 80 is not patterned but is formed as a single body for two adjacent thin film transistors (TFTs) 10 and 50. In this case, cross-talk in which adjacent TFTs affect one another due to a leakage current, etc. may occur. Thus, in order to prevent cross-talk from occurring, the semiconductor layer 80 should be patterned to be separately used by each TFT. However, in the case of an organic TFT using an organic semiconductor layer as the semiconductor layer 80, it is very difficult to pattern the semiconductor layer 80, and even if the organic semiconductor layer is patterned, electrical characteristics of the organic semiconductor layer are degraded.

Exemplary embodiments of the present invention will now be described with reference to the accompanying drawings.

As described above, when a semiconductor layer, in particular, an organic semiconductor layer, is formed as a single body with two or more adjacent thin film transistors (TFTs), cross-talk in which adjacent TFTs affect one another due to a leakage current, etc. may occur. In order to prevent cross-talk from occurring, the present invention proposes a flat panel display device having a thin film transistor (TFT) in which one of a source electrode and a drain electrode surrounds the other electrode in the same plane.

Figure 4:
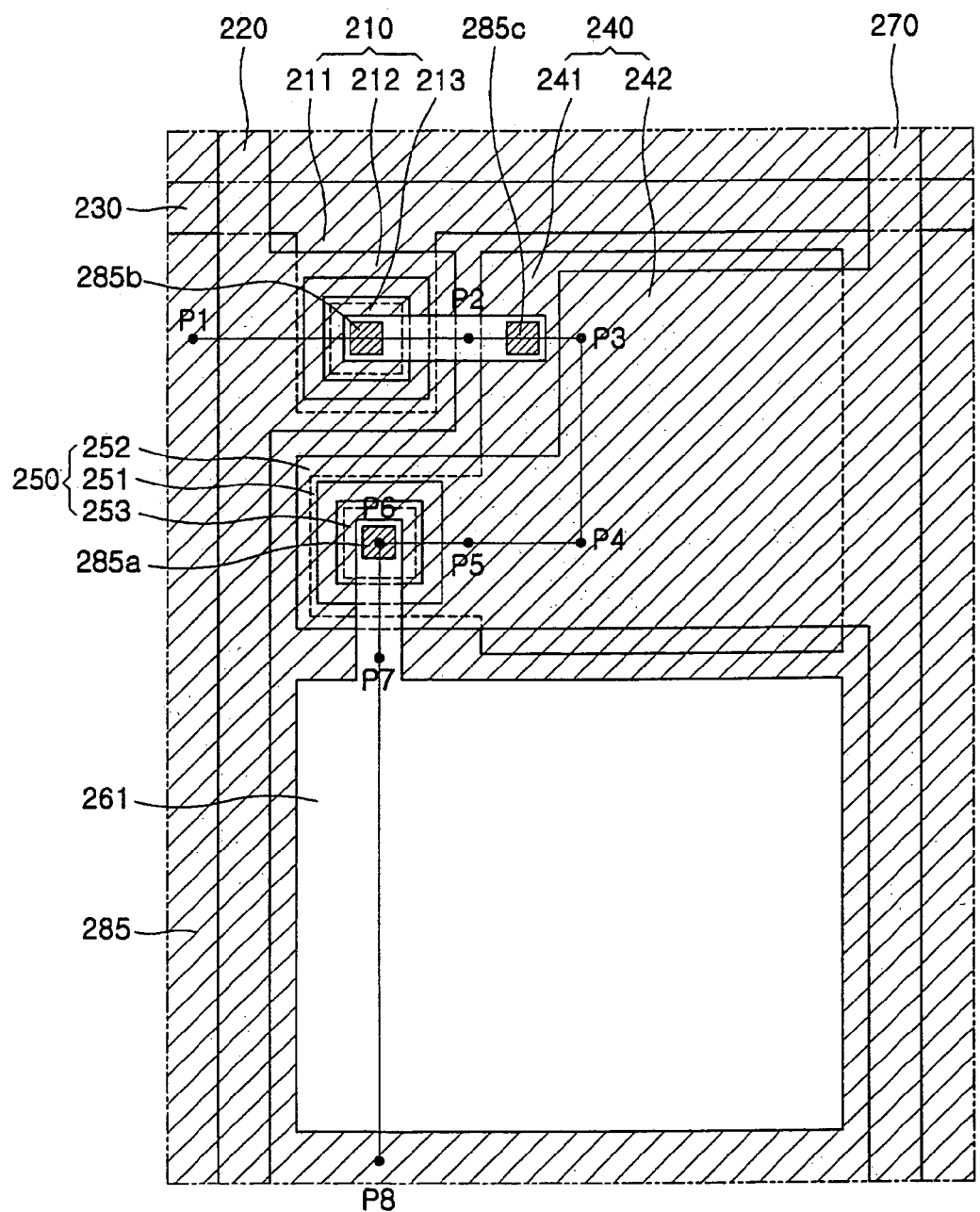
FIG. 4 is a schematic plan view of the portion A shown in FIG. 2.

A flat panel display device according to an embodiment of the present invention will now be described in greater detail. A first gate electrode is disposed on a substrate, and a first electrode, which is insulated from the first gate electrode, and a second electrode, which is insulated from the first gate electrode and surrounds the first electrode in the same plane, are formed on the first gate electrode. The first and second electrodes may be a drain electrode and a source electrode. A semiconductor layer is insulated from the first gate electrode and contacts the first electrode and the second electrode, and a display element includes a pixel electrode electrically connected to one of the first electrode and the second electrode. The semiconductor layer may be an organic semiconductor layer. In this case, the gate electrode may be disposed above or below a space between the first electrode and the second electrode which surrounds the first electrode in the same plane. In FIG. 4, the gate electrode is disposed below the space between the first electrode and the second electrode which surrounds the first electrode in the same plane.

In this structure, since a channel formed by the gate electrode is formed only between the first electrode and the second electrode which surrounds the first electrode in the same plane, and current flows only between the first electrode and the second electrode which surrounds the first electrode in the same plane, cross-talk between adjacent thin film transistors (TFTs) can be prevented from occurring even though the semiconductor layer is not patterned.

A thin film transistor (TFT) having the above structure may be a TFT in which the semiconductor layer is formed on the first electrode and the second electrode surrounding the first electrode in the same plane, or a TFT in which the semiconductor layer is formed under the first electrode and the second electrode. The TFT may be any TFT in which one of a source electrode and a drain electrode of the TFT surrounds the other electrode in the same plane.

The first gate electrode may be disposed only above or below a space between the first electrode and the second electrode which surrounds the first electrode in the same plane, that is, the first gate electrode may have a doughnut or torus shape in which a middle portion of the first gate electrode is empty. This is because if the first gate electrode is not formed in a doughnut shape and forms a capacitor structure with the first electrode, a parasitic capacitance between the first electrode and the first gate electrode may occur.

In a flat panel display device including a TFT having the above structure and a display element connected to and driven by the TFT, the display element may be an electroluminescence display element or a liquid crystal display element.

The flat panel display device according to the present invention may be, for example, an electroluminescence display device. An electroluminescence display device according to an embodiment of the present invention will now be described.

The electroluminescence display device includes a plurality of pixels including subpixels emitting red, green, and blue, from an emission layer. Each subpixel producing red, green, or blue includes an electroluminescence display element, which is a self-emission element, and at least one or more thin film transistors (TFTs) connected to the electroluminescence display element. As described above, the TFTs may be TFTs in which one of a source electrode and a drain electrode surrounds the other electrode in the same plane. In this case, the TFTs are connected to the electroluminescence display element in the above-described shape.

The electroluminescence display element is a light-emitting element driven by a current and emits red, green or blue light according to the flow of current between two electrodes included in the electroluminescence display device, thereby forming a predetermined image. The structure of the electroluminescence display element will now be briefly described. The electroluminescence display element comprises a pixel electrode connected to one of a first electrode and a second electrode of a TFT, an opposite electrode, and an intermediate layer including at least an emission layer disposed between the pixel electrode and the opposite electrode. The opposite electrode may be formed as a single body for the all electroluminescence display elements or corresponding to each element. The present invention is not limited to the above-described structure and may have a variety of structures.

The pixel electrode serves as an anode electrode, and the opposite electrode serves as a cathode electrode. The pixel electrode and the opposite electrode may have opposite polarities.

The pixel electrode may be a transparent electrode or a reflection electrode. When the pixel electrode is a transparent electrode, the pixel electrode may be formed of ITO, IZO, ZnO or $In_2O_3$. When the pixel electrode is a reflection electrode, after a reflection layer is formed of Ag, Mg, Al, Pt, Pd, Au, Ni, Nd, Ir, Cr or a compound thereof, the pixel electrode may be formed of ITO, IZO, ZnO or $In_2O_3$ on the reflection layer.

The opposite electrode may also be a transparent electrode or a reflection electrode. When the opposite electrode is a transparent electrode, Li, Ca, LiF/Ca, LiF/Al, Al, Ag, Mg or a compound thereof is deposited on the intermediate layer, and an auxiliary electrode layer or a bus electrode line may be formed of a material used in forming the transparent electrode, such as ITO, IZO, ZnO or $In_2O_3$, on a deposited resultant. When the opposite electrode is the reflection electrode, the opposite electrode is formed by depositing Li, Ca, LiF/Ca, LiF/Al, Al, Mg or a compound thereof on the entire surface of the electroluminescence display element. However, the present invention is not limited to this and the pixel electrode and the opposite electrode may be formed of an organic material such as conductive polymer etc.

The electroluminescence display element is classified as an inorganic electroluminescence display element or an organic electroluminescence display element depending on whether the intermediate layer is an inorganic layer or an organic layer. In the latter case, the intermediate layer may be a low molecular organic film or a high molecular organic film.

When the intermediate layer is a low molecular organic film, the intermediate layer may be a hole injection layer (HIL), a hole transport layer (HTL), an emission layer (EML), an electron transport layer (ETL), or an electron injection layer (EIL) with a single or composite structure. The intermediate layer may be formed of an organic material such as copper phthalocyanine (CuPc), N,N'-Di(naphthalene-1-yl)-N,N'-diphenyl-benzidine (NPB), tris-8-hydroxyquinoline aluminum (Alq3) or the like. The low molecular organic film may be formed by heating an organic substance in a vacuum state and depositing the organic substance. The structure of the intermediate layer is not limited to this and the intermediate layer may be one of a variety of layers.

When the intermediate layer is a high molecular organic film, the intermediate layer may be usually a HTL and an EML. A high molecular HTL may be formed by ink-jet printing or spin coating using poly-(2,4)-ethylene-dihydroxy thiophene (PEDOT), polyaniline (PANI), or the like. A high molecular EML may be formed of PPV, a soluble PPV, cyano-PPV, polyfluorene, or the like. A color pattern of the EML may be formed using a general method such as ink-jet printing or spin coating, or thermal transfer using a laser. In the case of the high molecular organic film, the structure of the intermediate layer is not limited to the above and the intermediate layer may be one of a variety of layers as necessary.

In the case of the inorganic electroluminescence display element, the intermediate layer may be an inorganic film and includes an emission layer and an insulating layer interposed between the emission layer and an electrode. The structure of the intermediate layer is not limited to this and the intermediate layer may be one of a variety of layers as necessary.

The emission layer may be formed of a metallic sulfide such as ZnS, SrS or CaS, an alkali-earth potassium sulfide such as $CaGa_2S_4$ or $SrGa_2S_4$, or emission atoms such as a transition metal including Mn, Ce, Th, Eu, Tm, Er, Pr, and Pb etc. or alkali-rare earth metals.

In the electroluminescence display element having the above-described structure, as described above, a drain electrode of a TFT in which one of a source electrode and a drain electrode surrounds the other electrode in the same plane, is connected to a pixel electrode of the electroluminescence display element such that a flow of current to pixel electrode is controlled and emission of each pixel is controlled.

As described above, the organic TFT may also be formed in a liquid crystal display panel. The structure of a liquid crystal display panel according to an embodiment of the present invention will now be briefly described.

Alignment layers align a liquid crystal layer between first and second substrates which face each other. A pixel electrode is formed between the alignment layer and the first substrate, an opposite electrode is formed between the alignment layer and the second substrate, and a color filter layer is interposed between the second substrate and the opposite electrode.

A first polarization layer is formed on a side of the first substrate not facing the second substrate, a second polarization layer is formed on a side of the second substrate not facing the first substrate, and a protective film is formed on a top surface of the second polarization layer.

In the liquid crystal display element having the above structure, the pixel electrode is connected to a drain electrode of a TFT in which one of a source electrode and the drain electrode surrounds the other electrode in the same plane, such that a potential difference exists between the pixel electrode and the opposite electrode due to an external signal controlled by the TFT. The arrangement of the liquid crystal layer is determined by the potential difference, and a visible ray supplied from a back light unit (BLU) disposed under the first substrate of the liquid crystal display panel is blocked or transmitted according to the arrangement of the liquid crystal layer, and light gains color while passing through the color filter layer, thereby forming an image.

The TFT may also be included in a variety of flat panel display devices besides an electroluminescence display device or a liquid crystal display device. For example, the TFT may be included in all types of devices including a TFT, such as an electronic sheet, a smart card, or a product tag or plastic chip for radio frequency identification (RFID). In embodiments that will be described, for explanatory convenience, the case where an electroluminescence display element is connected to a TFT in which one of a source electrode and a drain electrode surrounds the other electrode in the same plane is an electroluminescence display device will be described.

Figure 2:
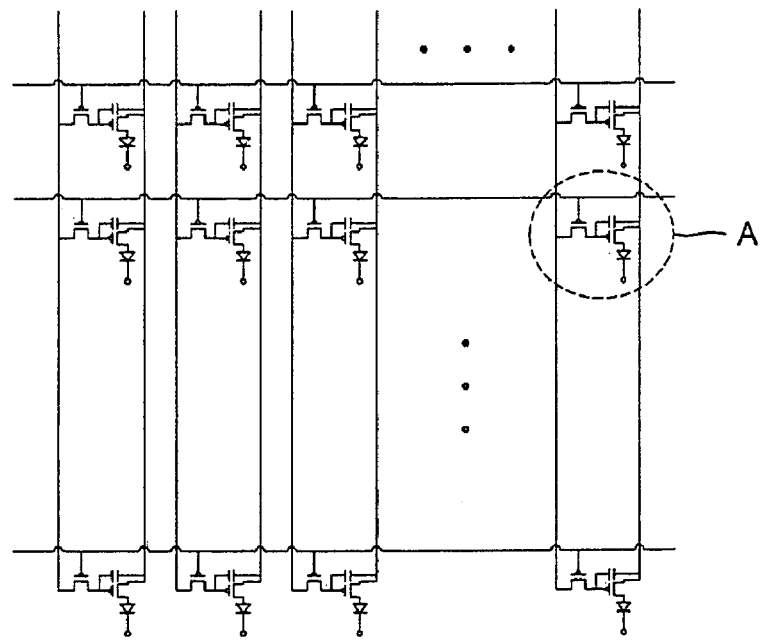
FIG. 2 is a schematic circuit diagram of an active matrix electroluminescence display device according to an embodiment of the present invention.
Figure 3:
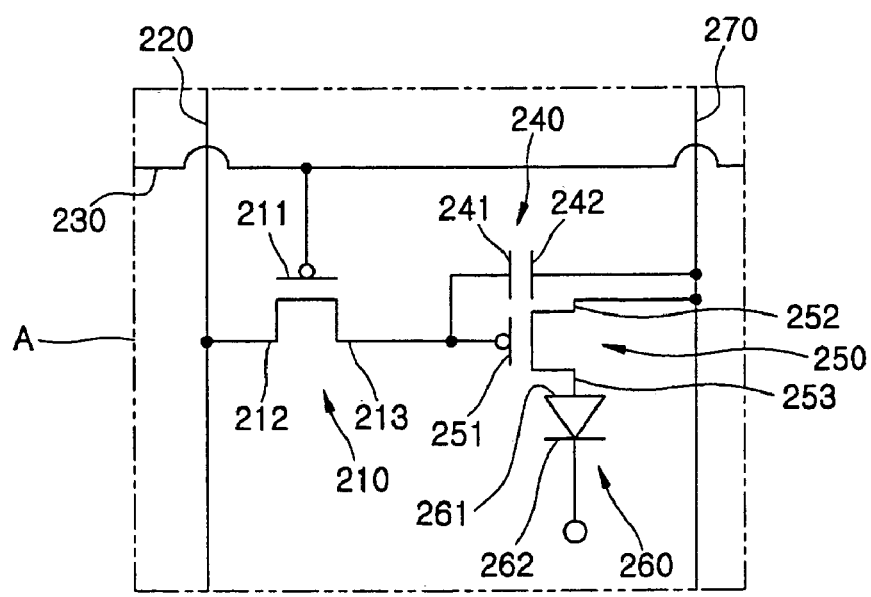
FIG. 3 a circuit diagram of a portion A shown in FIG. 2.
Figure 5:
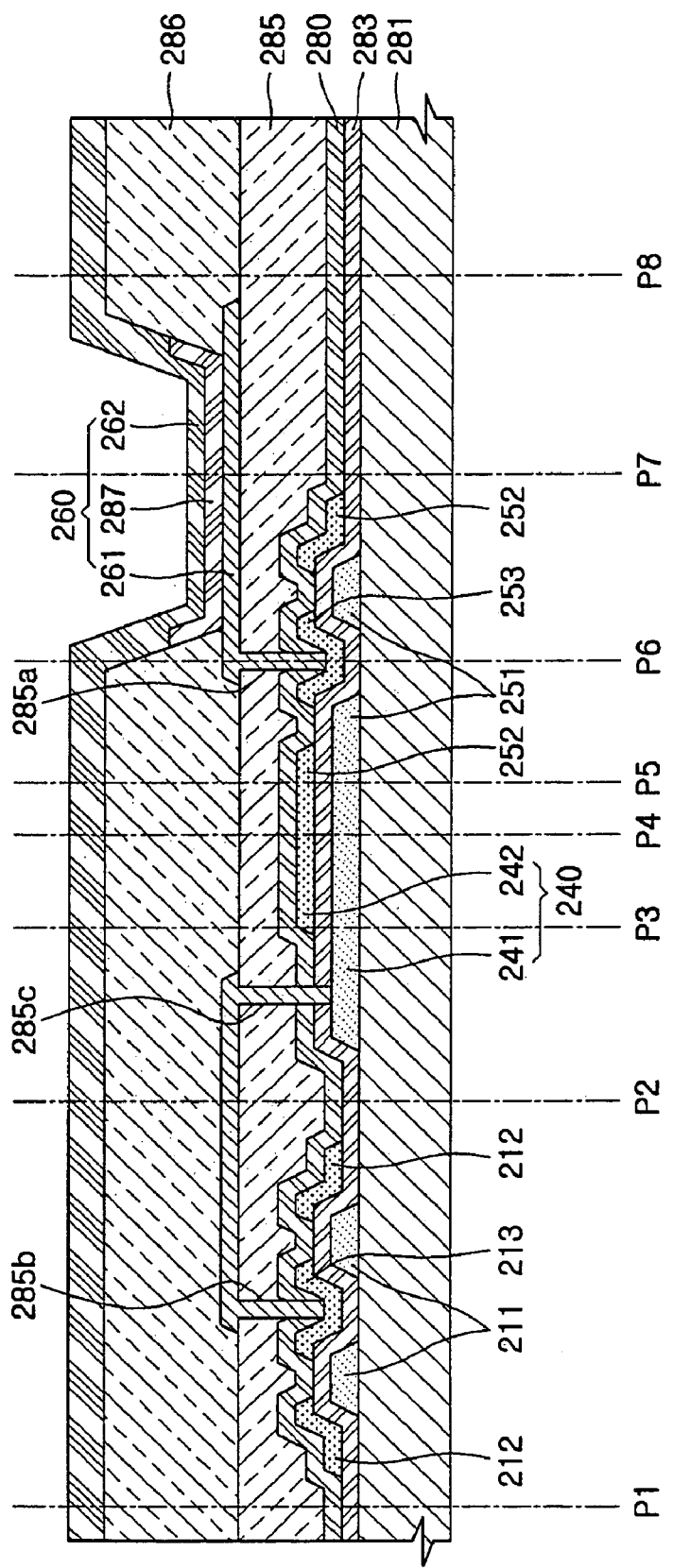
FIG. 5 is a schematic cross-sectional view of a subpixel unit of the active matrix electroluminescence display device shown in FIG. 4, taken along points P1 through P8.

FIG. 2 is a schematic circuit diagram of an active matrix electroluminescence display device according to another embodiment of the present invention, FIG. 3 is a circuit diagram of a portion A shown in FIG. 2, FIG. 4 is a schematic plane view of the active matrix electroluminescence display device of a portion A shown in FIG. 2, and FIG. 5 is a schematic cross-sectional view of a subpixel unit of the active matrix electroluminescence display device shown in FIG. 4, taken along points P1 through P8.

Referring to FIGS. 2 through 5, the active matrix electroluminescence display device includes a first TFT 250 which drives a display element and in which one of a source electrode and a drain electrode surrounds the other electrode in the same plane, a storage capacitor 240 that is electrically connected to the first TFT 250, and a second TFT 210 which drives the first TFT 250 and in which one of a source electrode and a drain electrode surrounds the other electrode in the same plane.

The first TFT 250 includes a first gate electrode 251 formed on a substrate 281, a first electrode 253 insulated from the first gate electrode 251, and a second electrode 252 which is insulated from the first gate electrode 251 and surrounds the first electrode 253 in the same plane. The first TFT 250 further includes a semiconductor layer 280 which is insulated from the first gate electrode 251 and contacts the first electrode 253 and the second electrode 252. A pixel electrode 261 of the display element is connected to one of the first electrode 253 and the second electrode 252. As shown in FIGS. 4 and 5, the pixel electrode 261 is connected to the first electrode 253. In this case, the first electrode 253 of the first TFT 250 may be a drain electrode, and the second electrode 252 of the first TFT 250 which surrounds the first electrode 253, may be a source electrode. The case where the first electrode 253 is a drain electrode will now be described.

Referring to FIG. 4, the pixel electrode 261 is disposed where the first TFT 250, the second TFT 210 and the storage capacitor 240 are not disposed. That is, the flat panel display device is a rear emission display device in which light generated in the display element connected to the pixel electrode 261 is emitted toward the substrate 281. However, this structure is shown for explanatory convenience. The pixel electrode 261 may be formed above the first TFT 250, the storage capacitor 240, and the second TFT 210, unlike in FIG. 4. This variation can be applied to embodiments that will be described later.

While an inverted coplanar TFT in which the semiconductor layer 280 is formed on the first electrode 253 and the second electrode 252 is shown in FIGS. 4 and 5, the flat panel display device may include an inverted staggered TFT in which the semiconductor layer 280 is formed under the first electrode 253 and the second electrode 252. The structure of the inverted staggered TFT will be described later in an additional embodiment.

Referring to FIGS. 4 and 5, the first gate electrode 251 is disposed above or below a space only between the first electrode 253 and the second electrode 252 which surrounds the first electrode 253 in the same plane, that is, the first gate electrode 251 has a donut (or doughnut) shape (or a torus shape) in which a middle portion of the first gate electrode 251 is empty. This is because if the first gate electrode 251 is not formed in a torus shape and forms a capacitor structure with the first electrode 253, a parasitic capacitance between the first electrode 253 and the first gate electrode 251 may occur.

Referring to FIGS. 2 through 5, the flat panel display device may further include the storage capacitor 240 which is electrically connected to the first TFT 250. The storage capacitor 240 includes a first capacitor electrode 241 and a second capacitor electrode 242. The first capacitor electrode 241 is electrically connected to the first gate electrode 251, and the second capacitor electrode 242 is electrically connected to the second electrode 252 and a third conducting wire 270.

Referring to FIGS. 4 and 5, the first capacitor electrode 241 and the first gate electrode 251 may be formed as a single body, and the second capacitor electrode 242 and the second electrode 252 may be formed as a single body.

Referring to FIGS. 2 through 5, as described above, the flat panel display device having an active matrix electroluminescence display device according to the present embodiment may further include a second TFT, in particular, the second TFT 210, in which one of a source electrode and a drain electrode surrounds the other electrode in the same plane. Referring to FIGS. 4 and 5, the second TFT 210 includes a second gate electrode 211, a third electrode 213 insulated from the second gate electrode 211, a fourth electrode 212 which is insulated from the second gate electrode 211 and surrounds the third electrode 213 in the same plane, and a semiconductor layer 280 which is insulated from the second gate electrode 211 and contacts the third electrode 213 and the fourth electrode 212. One of the third electrode 213 and the fourth electrode 212 is electrically connected to the first gate electrode 251. In FIGS. 4 and 5, the third electrode 213 is connected to the first gate electrode 251.

In the above-described structure, the third electrode 213 and the fourth electrode 212 need only be formed above the second gate electrode 211. Thus, even in this case, the second TFT 210 may be an inverted coplanar TFT or an inverted staggered TFT. Thus, the second TFT 210 may be an inverted coplanar TFT having the same structure as that of the first TFT 250. Both the first TFT 250 and the second TFT 210 may be an inverted staggered TFT, which will be described in a later embodiment.

In the second TFT 210 having the above structure, for the same reason with reference to the first TFT 250 described above, the second gate electrode 211 may be disposed above or below a space between the third electrode 213 and the fourth electrode 212. One of the third electrode 213 and the fourth electrode 212 is a source electrode, and the other electrode thereof is a drain electrode. Referring to FIGS. 4 and 5, the third electrode 213 is a second drain electrode, and the fourth electrode 212 is a second source electrode. A structure in which the third electrode 213 is a second source electrode and the fourth electrode 212 is a second drain electrode that will be described later in a later embodiment.

In the above-described structure, a gate insulating layer 283 may be further formed on the entire surface of the substrate 281 to cover the first gate electrode 251, the second gate electrode 211, and the first capacitor electrode 241, and a protective layer 285 may be further formed on the entire surface of the substrate 281 to cover the second capacitor electrode 242 and the semiconductor layer 280. In this case, a contact hole can be formed so that the storage capacitor 240 is connected to the first TFT 250 and the second TFT 210, which will now be described.

As previously described, the TFT of the flat panel display device according to the present embodiment is an inverted coplanar TFT in which the semiconductor layer 280 is formed on the first through fourth electrodes 253, 252, 213, and 212. In this case, as described above, the third electrode 213 and the first capacitor electrode 241 are connected to each other. To this end, a first contact hole 285b is formed in the protective layer 285 and the semiconductor layer 280 so that a portion of the third electrode 213 is exposed. A second contact hole 285c is formed in the protective layer 285, the semiconductor layer 280, and the gate insulating layer 283 so that a portion of the first capacitor electrode 241 is exposed. The third electrode 213 and the first capacitor electrode 241 are connected to each other by an interconnection formed in the first contact hole 285b and the second contact hole 285c and on the protective layer 285. In this case, the interconnection which connects the third electrode 213 and the first capacitor electrode 241 to each other may be formed of the same material as the pixel electrode 261 connected to the first electrode 253, that is, a first drain electrode of the first TFT 250.

The correlation between the structures of the first TFT 250 and the second TFT 210 will be described with reference to FIGS. 2 through 5. The fourth electrode 212 of the second TFT 210 is connected to a driving circuit (not shown) by a first conducting line 220, the second gate electrode 211 of the second TFT 210 is connected to the driving circuit by a second conducting line 230, and the third electrode 213 of the second TFT 210 is connected to the first capacitor electrode 241 of the storage capacitor 240 and the first gate electrode 251 of the first TFT 250. In this structure, the fourth electrode 212 is a source electrode of the second TFT 210, and the third electrode 213 is a drain electrode of the second TFT 210. In addition, the first conducting line 220 may be a data line which transmits a data line, and the second conducting line 230 may be a scan line. In this case, the second TFT 210 serves as a switching transistor (TR), and the first TFT 250 serves as a driving TR (transistor). Two or more transistors may be used in the above circuit. The case where two transistors such as a switching transistor and a driving transistor are used has been described in the present embodiment and will be described in subsequent embodiments.

The second capacitor electrode 242 of the storage capacitor 240 and the second electrode 252 of the first TFT 250 is connected to the third conducting line 270, and the first electrode 253 of the first TFT 250 is connected to the pixel electrode 261 of a display unit 260. In this structure, the second electrode 252 is a source electrode of the first TFT 250, and the first electrode 253 is a drain electrode of the first TFT 250.

As previously described, the display unit 260 may be an electroluminescence element. In this case, referring to FIG. 5, an opposite electrode 262 of the display unit 260 is formed above the pixel electrode 261 with an intermediate layer 287 including at least an emission layer formed between the pixel electrode 261 and the opposite electrode 262. In addition, a pixel define layer 286 may be further included. The pixel define layer may be made of $SiO_2$, SiNx, or other material. The structure and composition of the pixel electrode 261, the opposite electrode 262, and the intermediate layer 287 are as described above.

The operation of the active matrix electroluminescence display device will now be briefly described.

If a voltage is applied to the second gate electrode 211 by a driving circuit (not shown), a conductive channel is formed in the semiconductor layer 280 which connects the fourth electrode, that is, the second source electrode 212, and the third electrode, that is, the second drain electrode 213, to each other. In this case, if a charge for determining the amount of light to be generated in the intermediate layer 287 including the emission layer is supplied to the second source electrode 212, the charge moves to the second drain electrode 213. Then, the charge accumulates in the first capacitor electrode 241 from the second drain electrode 213 and a predetermined charge supplied via the third conducting line 270 accumulates in the second capacitor electrode 242, such that a voltage for determining the amount of light to be generated in the intermediate layer 287 including the emission layer is formed between the first capacitor electrode 241 and the second capacitor electrode 242. Then, an equivalent voltage is produced between the first gate electrode 251 and the second electrode, that is, the first source electrode 252, and the charge that moves to the display unit, that is, the pixel electrode 261 of the electroluminescence display element 260, via the first drain electrode 253, that is, the amount of the charge for determining the amount of light to be generated in the intermediate layer 287 including the emission layer is controlled.

In the active matrix electroluminescence display device having the above-described structure, a plurality of TFTs such as a driving transistor and a switching transistor are used in each subpixel. Thus, if cross-talk occurs in these TFTs, the amount of light generated in the display unit 260 is not properly controlled and therefore, a proper image cannot be produced.

Thus, in the case of using the TFT in which one of the source electrode and the drain electrode surrounds the electrode in the same plane, cross-talk can be prevented from occurring without patterning the semiconductor layer such that a more clear and precise image can be produced.

Figure 6:
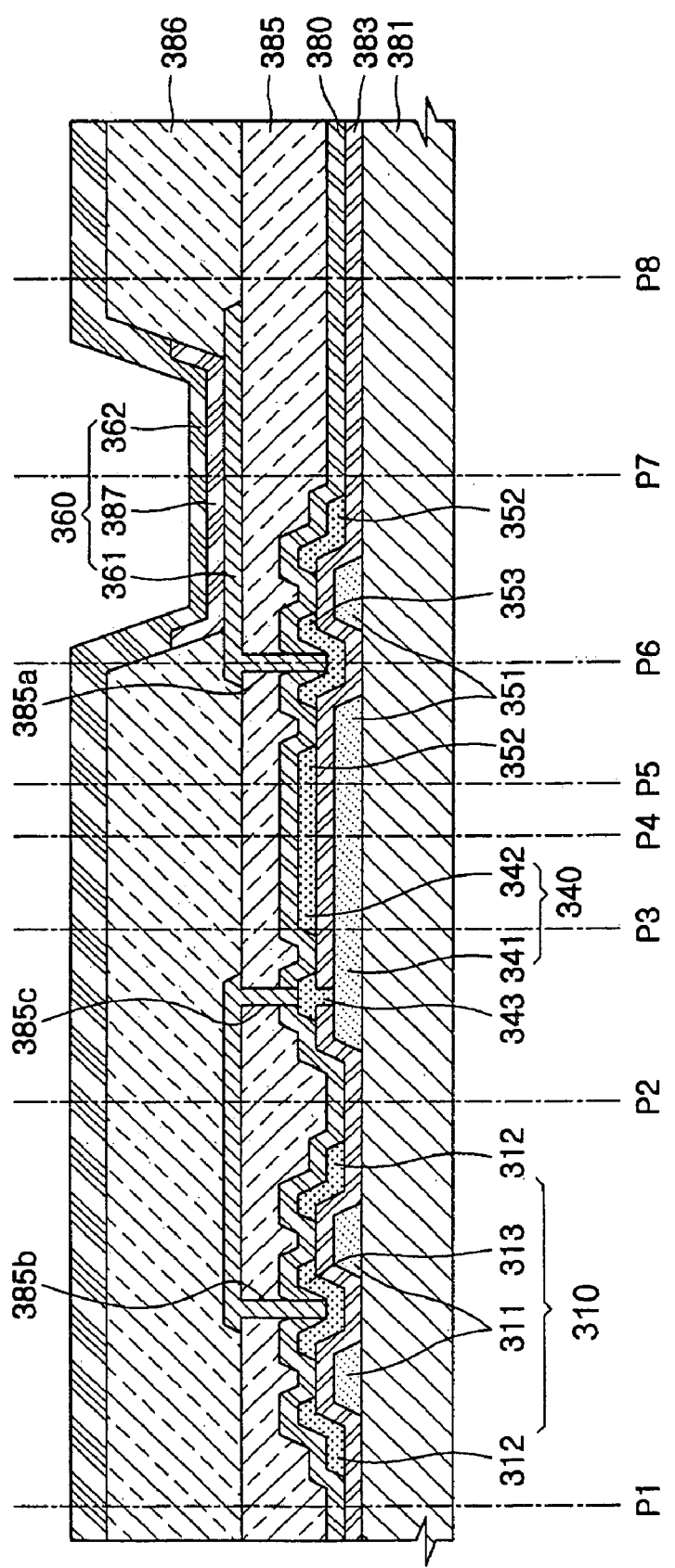
FIG. 6 is a schematic cross-sectional view of a subpixel unit of an active electroluminescence display device according to another embodiment of the present invention.

FIG. 6 is a schematic cross-sectional view of a subpixel unit of an active matrix electroluminescence display device according to still another embodiment of the present invention.

The active matrix electroluminescence display device shown in FIG. 6 is different from the active matrix electroluminescence display device according to the previous embodiment of the present invention in that a metallic layer 343 is further formed when the third electrode 313 of a second TFT 310 and the first capacitor electrode 341 of the storage capacitor 340 are connected to each other.

As described above, in order to connect the third electrode 313 and the first capacitor electrode 341 to each other, a first contact hole 385b is formed in a protective layer 385 and a semiconductor layer 380 so that a portion of the third electrode 313 is exposed and a second contact hole 385c is formed between the protective layer 385, the semiconductor layer 380, and a gate insulating layer 383 so that a portion of the first capacitor electrode 341 is exposed. The third electrode 313 and the first capacitor electrode 341 are connected to each other by an interconnection formed in the first contact hole 385b and the second contact hole 385c and on the protective layer 385. As previously described, the interconnection which connects the third electrode 313 and the first capacitor electrode 341 to each other, may be formed of the same material as the pixel electrode 361 connected to the first electrode 353, that is, a first drain electrode of a first TFT 350 is formed. This applies to embodiments that will be described later.

When the third electrode 313 and the first capacitor electrode 341 are connected by the interconnection, in order to securely contact the interconnection and the first capacitor electrode 341 with each other, a metallic layer 343 formed on the gate insulating layer 383 and connected to the first capacitor electrode 341 via the second contact hole 385c formed in the gate insulating layer 383 may be further formed on the interconnection. In this case, the metallic layer 343 may be formed of the same material as the first through fourth electrodes 353, 352, 313, and 312, and the second capacitor electrode 342.

With this structure, a defect in which the interconnection does not contact the first capacitor electrode 341 in the second contact hole 385c can be prevented when the third electrode 313 and the first capacitor electrode 341 are connected to each other.

Figure 7:
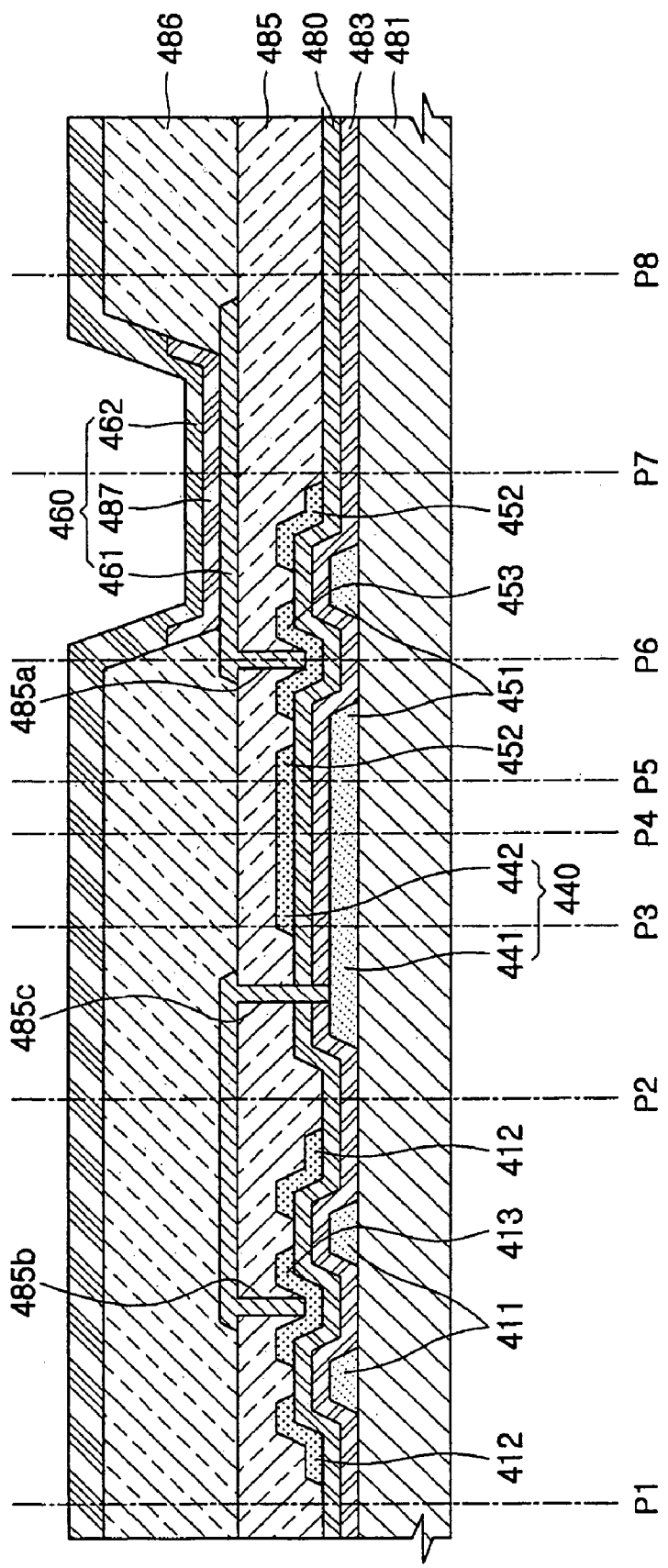
FIG. 7 a schematic cross-sectional view of a subpixel unit of an active electroluminescence display device according to another embodiment of the present invention.

FIG. 7 is a schematic cross-sectional view of a subpixel unit of an active matrix electroluminescence display device according to another embodiment of the present invention. The active matrix electroluminescence display device shown in FIG. 7 is different from the active matrix electroluminescence display device according to the embodiment of the present invention shown in FIG. 6 in that a first TFT 450 and a second TFT 410 are not inverted coplanar TFTs but inverted staggered TFTs. In other words, first through fourth electrodes 453, 452, 413, and 412 are formed on a semiconductor layer 480.

As described above, referring to FIG. 7, even though the inverted staggered TFT in which the semiconductor layer 480 is not patterned in each TFT that is used, a TFT in which one of a source electrode and a drain electrode surrounds the other electrode in the same plane such that cross-talk can be prevented from occurring and a more clear and precise image can be produced is used.

Figure 8:
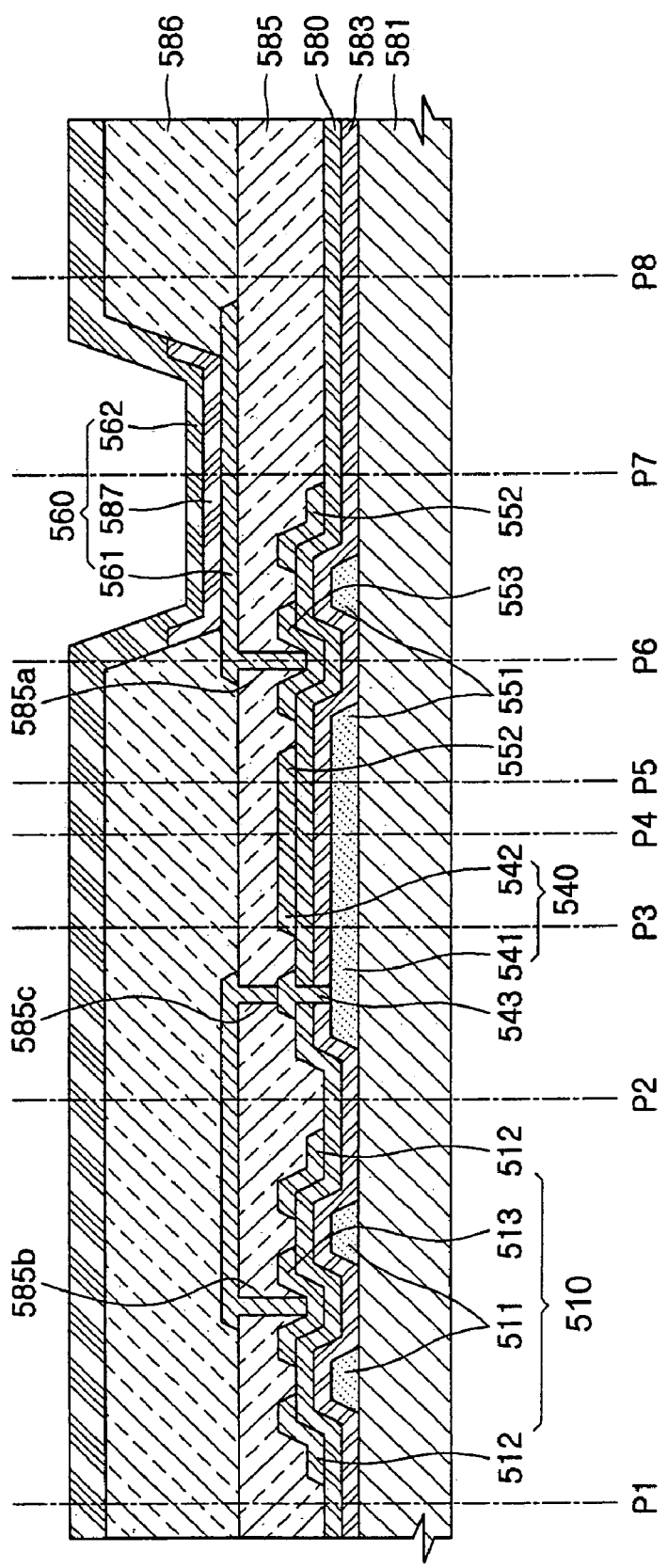
FIG. 8 is a schematic cross-sectional view of a subpixel unit of an active matrix electroluminescence display device according to another embodiment of the present invention.

FIG. 8 is a schematic cross-sectional view of a subpixel unit of an active matrix electroluminescence display device according to another embodiment of the present invention. The active matrix electroluminescence display device shown in FIG. 8 is a display device having an inverted staggered TFT like the active matrix electroluminescence display device shown in FIG. 7. The active matrix electroluminescence display device shown in FIG. 8 is different from the active matrix electroluminescence display device according to the previous embodiment of the present invention in that a metallic layer 543 is further formed when a third electrode 513 of a second TFT 510 is connected to a first capacitor electrode 541 of a storage capacitor 540.

In the active matrix electroluminescence display device according to the present embodiment, in order to connect the third electrode 513 and the first capacitor electrode 541 to each other, a first contact hole 585b is formed in a protective layer 585 and a semiconductor layer 580 so that a portion of the third electrode 513 is exposed and a second contact hole 585c is formed through the protective layer 585, the semiconductor layer 580, and a gate insulating layer 583 so that a portion of the first capacitor electrode 541 is exposed.

The third electrode 513 and the first capacitor electrode 541 are connected to each other by an interconnection formed in the first contact hole 585b and the second contact hole 585c and on the protective layer 585, as in the active matrix electroluminescence display device according to the embodiment shown in FIG. 7.

In the present embodiment, when the third electrode 513 and the first capacitor electrode 541 are connected to each other by the interconnection, the metallic layer 543 formed on the semiconductor layer 580 and connected to the first capacitor electrode 541 via the second contact hole 585c formed in the semiconductor layer 580 and the gate insulating layer 583 formed under the semiconductor layer 580 may be further formed on the interconnection so that the interconnection and the first capacitor electrode 541 contact each other securely. In this case, the metallic layer 543 may be formed of the same material as the first through fourth electrodes 553, 552, 513, and 512, and the second capacitor electrode 542.

With this structure, a defect in which the interconnection does not contact the first capacitor electrode 541 through the second contact hole 585c can be prevented from occurring when the third electrode 513 and the first capacitor electrode 541 are connected to each other.

Figure 9:
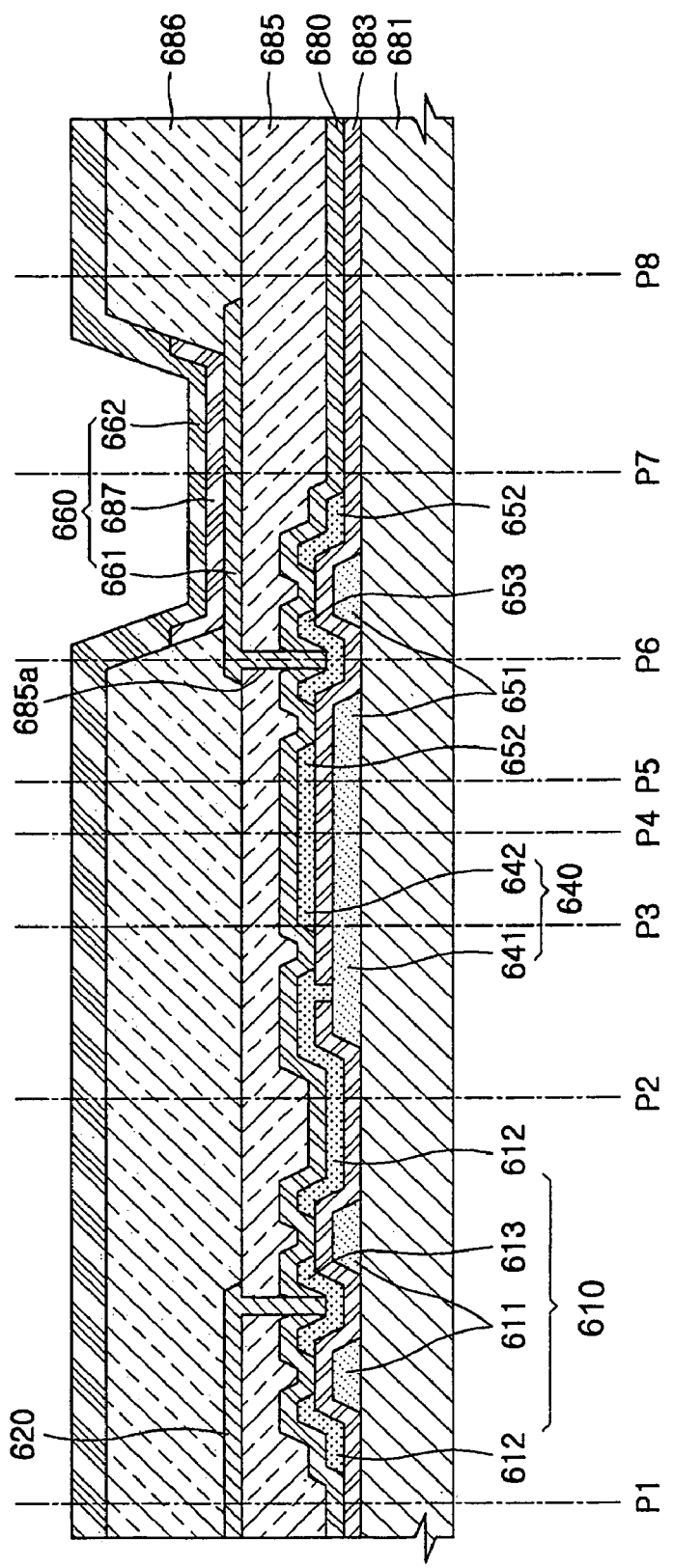
FIG. 9 is a schematic cross-sectional view of a subpixel unit of an active electroluminescence display device according to another embodiment of the present invention.

FIG. 9 is a schematic cross-sectional view of a subpixel unit of an active matrix electroluminescence display device according to another embodiment of the present invention.

The active matrix electroluminescence display device shown in FIG. 9 is different from the active matrix electroluminescence display device according to another embodiment shown in FIG. 5 in that the positions of a source electrode and a drain electrode of a second TFT 610 are different from each other.

In other words, in the embodiment shown in FIGS. 4 and 5, the fourth electrode 212 surrounds the third electrode 213, the third electrode 213 is a drain electrode, the fourth electrode 212 is a source electrode, and the third electrode 213 is connected to the first capacitor electrode 241 of the storage capacitor 240. The present embodiment is the same in that a fourth electrode 612 surrounds a third electrode 613. However, the third electrode 613 is a source electrode, the fourth electrode 612 is a drain electrode, the fourth electrode 612 is connected to a first capacitor electrode 641 of a storage capacitor 640 and then is electrically connected to a first gate electrode 651, and the third electrode 613 is connected to a second interconnection 620.

In this structure, the fourth electrode 612 and the first capacitor 641 are connected to each other. Thus, unlike in the previous embodiments, the fourth electrode 612 and the first capacitor electrode 641 can be connected to each other without using an interconnection formed on a protective layer 685. In addition, unlike the active matrix electroluminescence display devices shown in FIGS. 6 and 8, a metallic layer need not be further formed, and therefore, the fourth electrode 612 and the first capacitor electrode 641 are securely connected to each other.

Figure 10:
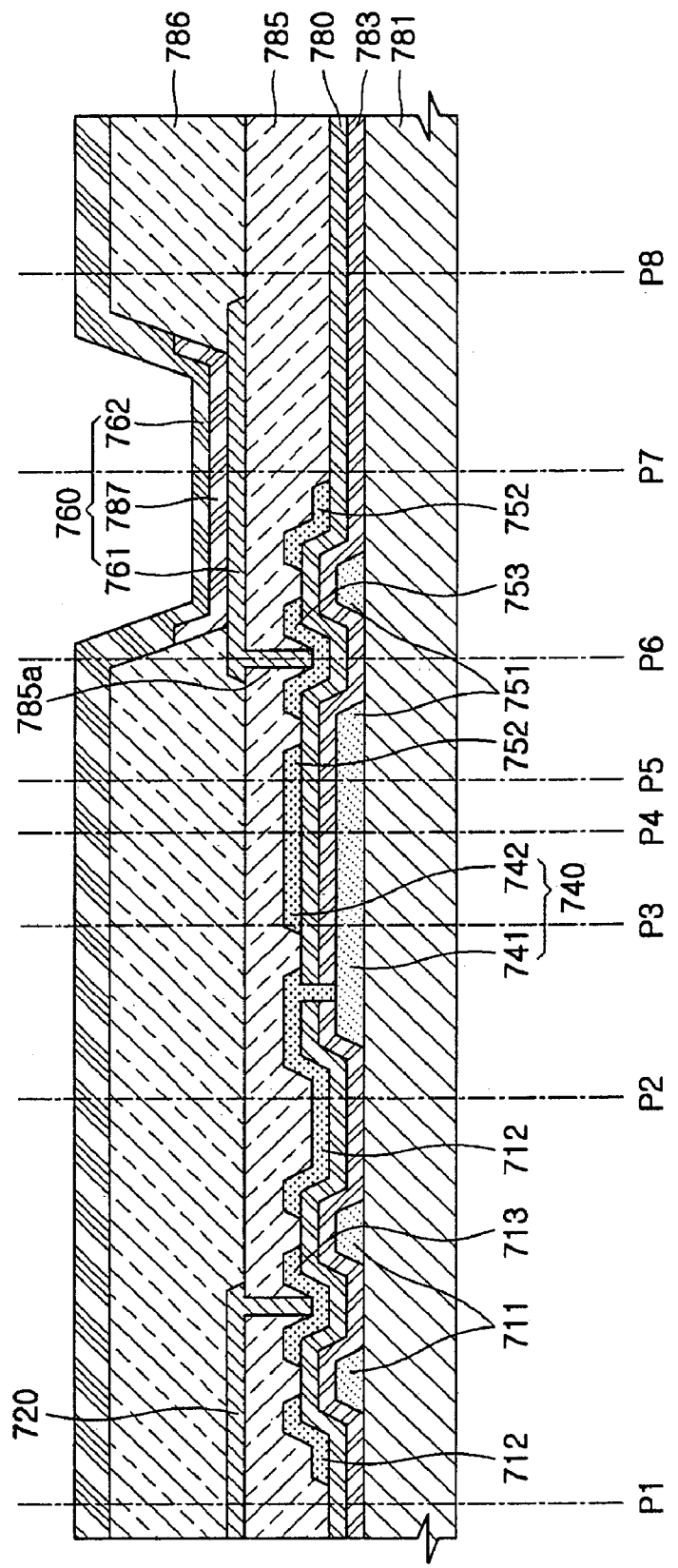
FIG. 10 is a schematic cross-sectional view of a subpixel unit of an active electroluminescence display device according to another embodiment of the present invention.

The active matrix electroluminescence display device according to the present embodiment is a display device having an inverted coplanar TFT in which a semiconductor layer 680 is formed on the first electrode 653 and the fourth electrode 612. However, like an active matrix electroluminescence display device shown in FIG. 10 according to another embodiment of the present invention, the present embodiment shown in FIG. 9 can be applied to a display device having an inverted staggered TFT in which a semiconductor layer 780 is formed under a first electrode 753 and a fourth electrode 712.

Figure 11:
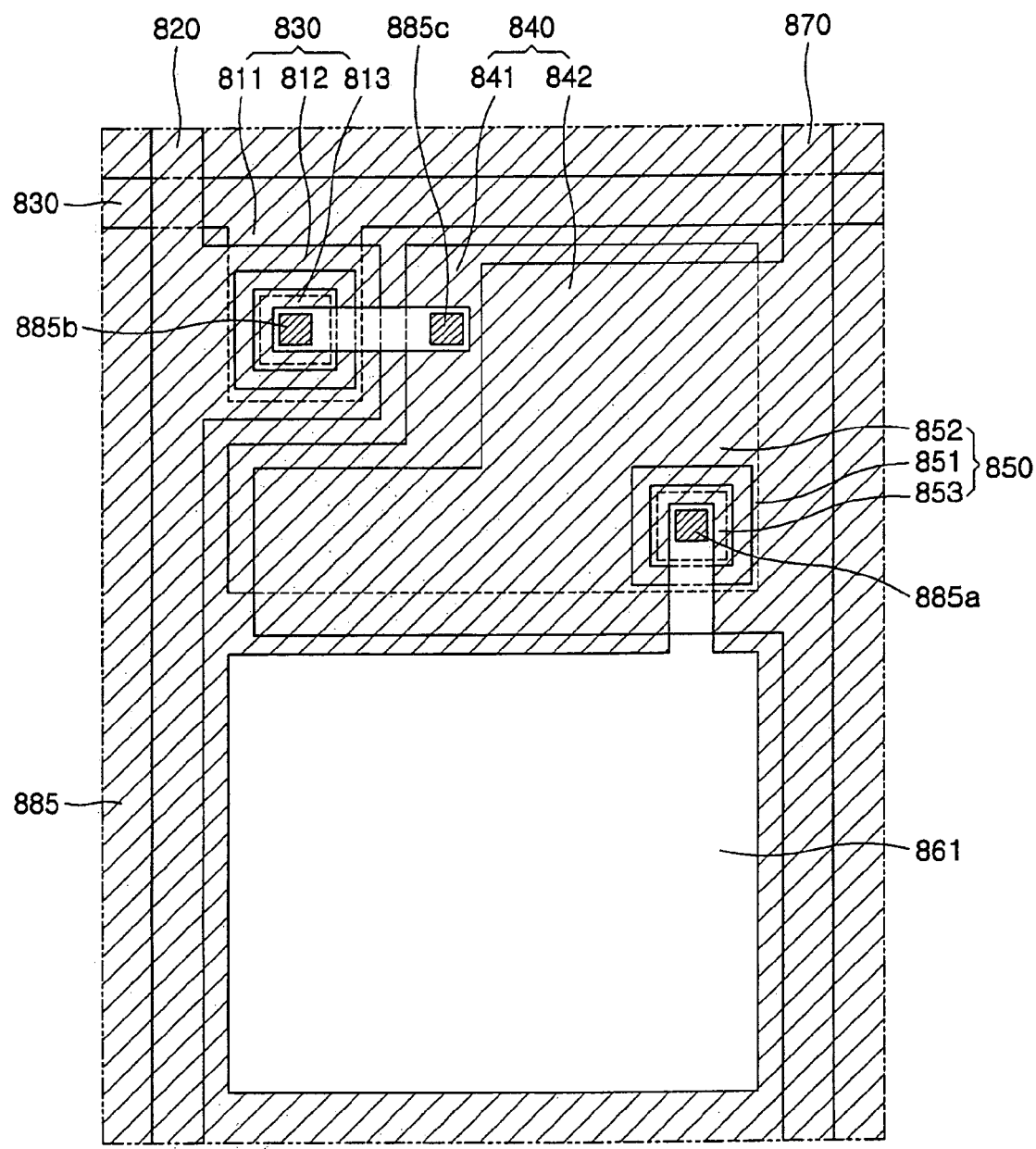
FIG. 11 is a schematic plan view of a subpixel unit of an active electroluminescence display device according to another embodiment of the present invention.

FIG. 11 is a schematic plane view of an active matrix electroluminescence display device according to another embodiment of the present invention.

As described above, when a semiconductor layer is not patterned but is formed as a single body for adjacent TFTs, so-called cross-talk in which adjacent TFTs affect one another due to a leakage current, etc. may occur. Thus, in order to prevent cross-talk from occurring, the semiconductor layer can be patterned in each TFT. However, in the case of an organic TFT including an organic semiconductor layer as the semiconductor layer, it is very difficult to pattern the semiconductor layer, and even if the organic semiconductor layer is patterned, electrical characteristics of the organic semiconductor layer are lowered.

Thus, in order to solve these problems, the present invention provides a flat panel display device having a TFT in which one of a source electrode and a drain electrode surrounds the other electrode in the same plane. In order to minimize the possibility of cross-talk between TFTs having this structure, referring to FIG. 11, a first TFT 850 and a second TFT 810 may be isolated from each other. With this structure, the possibility of cross-talk between adjacent TFTs can be minimized and a more clear and precise image can be produced.

Referring to FIGS. 4 through 11, since a TFT in which one of a source electrode and a drain electrode surrounds the other electrode in the same plane has a larger area than that of a conventional TFT, when the flat panel display device is a front emission display device in which light generated in a display element connected to the TFT having the above structure is emitted away from a substrate of the TFT, the TFT can be very useful. However, the present invention is not limited to this structure, and the flat panel display device may be a rear emission display device or a double emission display device.

In the embodiments shown in FIGS. 2 through 11, electroluminescence display elements in which two TFTs and a capacitor are electrically connected to an electroluminescence display element to drive the electroluminescence display element are shown, but the present invention is not limited to this. That is, as described above, the display element may be a liquid crystal display element. In this case, a variety of modifications can be made in which one or more than two TFTs and one capacitor are provided or in which two more TFTs without a capacitor are provided.

As described above, the following effects can obtained with the flat panel display device according to the present invention. First, by using a flat panel display device having a TFT in which one of a source electrode and a drain electrode surrounds the other electrode in the same plane, cross-talk between TFTs in which a semiconductor layer is not patterned can be prevented. Second, when a drain electrode of a TFT in which one of a source electrode and the drain electrode surrounds the other electrode in the same plane is connected to one electrode of a capacitor by an interconnection formed in contact holes and on an upper portion of a protective layer, a metallic layer connected to one electrode of the capacitor is formed on the interconnection such that the interconnection and one electrode of the capacitor securely contact each other. Third, by using a structure in which a drain electrode of a TFT surrounds a source electrode thereof in the same plane, the drain electrode and one electrode of a capacitor can contact each other more simply and securely.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A flat panel display device, comprising:
a substrate;
a first transistor, comprising:
 a first gate electrode formed on said substrate;
 a first drain electrode insulated from said first gate electrode;
 a first source electrode insulated from said first gate electrode and surrounding said first drain electrode in the same plane; and
 a first semiconductor layer disposed above and electrically contacting said first drain electrode and said first source electrode, and insulated from said first gate electrode;
a first capacitor electrode connected to said first gate electrode;
a second capacitor electrode connected to said first source electrode;
a second transistor, comprising:
 a second gate electrode;

a second drain electrode insulated from said second gate;

a second source electrode insulated from said second gate electrode and surrounding said second drain electrode; and a second semiconductor layer disposed above and electrically contacting said second drain electrode and said second source electrode, and insulated from said second gate electrode, with said second drain electrode being electrically connected to said first gate electrode, and said first semiconductor layer and second semiconductor layer together forming a semiconductor layer as a single body;

a gate insulating layer formed on said entire surface of said substrate and covering said first gate electrode, said second gate electrode, and said first capacitor electrode;

a protective layer formed on the entire surface of said substrate and covering said first drain electrode and said first source electrode, said second drain electrode and said second source electrode, said second capacitor electrode, and said semiconductor layer;

a first contact hole formed in said protective layer and said semiconductor layer to expose a portion of said second drain electrode;

a second contact hole formed in said protective layer, said semiconductor layer, and said gate insulating layer which correspond to a region other than the region between said first drain and source electrodes to expose a portion of said first capacitor electrode, with said second drain electrode and said first capacitor electrode being electrically connected to each other by an interconnection formed in said first contact hole and said second contact hole and on said protective layer; and a display element including a pixel electrode electrically connected to said first drain electrode.

2. The flat panel display device of claim 1, with said first drain electrode and said first source electrode being formed above said first gate electrode.

3. The flat panel display device of claim 1, with said first gate electrode being disposed above or below a space between said first drain electrode and said first source electrode.

4. The flat panel display device of claim 1, with said second drain electrode and said second source electrode being formed above said second gate electrode.

5. The flat panel display device of claim 1, with said second gate electrode being disposed above or below a space between said second drain electrode and said second source electrode.

6. The flat panel display device of claim 1, with said interconnection connecting said second drain electrode to said first capacitor electrode further comprising a metallic layer, which is connected to said first capacitor electrode via the second contact hole and formed of the same material as said second drain electrode, and formed on said gate insulating layer.

7. The flat panel display device of claim 1, with said pixel electrode being formed on said protective layer, and said interconnection connecting said second drain electrode to said first capacitor electrode being formed of the same material as said pixel electrode.

8. The flat panel display device of claim 1, wherein light generated in said display element is emitted away from said substrate.

9. The flat panel display device of claim 1, wherein said display element is an electroluminescence element.

10. A flat panel display device, comprising:
a substrate;
a first gate electrode formed on said substrate;
a first drain electrode insulated from said first gate electrode;
a first source electrode insulated from said first gate electrode and surrounding said first drain electrode in the same plane;
a first semiconductor layer insulated from said first gate electrode and electrically contacting said first source electrode and said first drain electrode;
a first capacitor electrode connected to said first gate electrode;
a second capacitor electrode connected to said first source electrode; and
a display element including a pixel electrode electrically connected to said first drain electrode, with said first capacitor electrode and said first gate electrode being formed as a single body, and said second capacitor electrode and said first source electrode being formed as a single body.

11. A flat panel display device, comprising:
a substrate;
a first transistor, comprising:
  a first gate electrode formed on said substrate;
  a first drain electrode insulated from said first gate electrode;
  a first source electrode insulated from said first gate electrode and surrounding said first drain electrode in the same plane; and
a first semiconductor layer disposed below and electrically contacting said first drain
electrode and said first source electrode, and insulated from said first gate electrode;
a first capacitor electrode connected to said first gate electrode;
a second capacitor electrode connected to said first source electrode;
a second transistor, comprising:
  a second gate electrode;
  a second drain electrode insulated from said second gate;
  a second source electrode insulated from said second gate electrode and surrounding said second drain electrode; and
  a second semiconductor layer disposed below and electrically contacting said second drain electrode and said second source electrode, and insulated from said second gate electrode, with said second drain electrode being electrically connected to said first gate electrode, and said first semiconductor layer and second semiconductor layer together forming a semiconductor layer as a single body;
a gate insulating layer formed on said entire surface of said substrate and covering said first gate electrode, said second gate electrode, and said first capacitor electrode;
a protective layer formed on the entire surface of said substrate and covering said first drain electrode and said first source electrode, said second drain electrode and said second source electrode, said second capacitor electrode, and said semiconductor layer;
a first contact hole formed in said protective layer to expose a portion of said second drain electrode;
a second contact hole formed on said protective layer, said semiconductor layer, and said gate insulating layer to expose a portion of said first capacitor electrode correspond to a region other than the region between said first drain and source electrodes, with said second drain electrode and said first capacitor electrode being connected to each other by an interconnection, formed in the first contact hole and the second contact hole, and on said protective layer; and
a display element including a pixel electrode electrically connected to said first drain electrode.

12. The flat panel display device of claim 11, with the interconnection connecting said second drain electrode to said first capacitor electrode further comprising a metallic layer, which is connected to said first capacitor electrode via the second contact hole and formed of the same material as said second drain electrode, and formed on said semiconductor layer.

13. The flat panel display device of claim 11, with said pixel electrode being formed on said protective layer, and the interconnection connecting said second drain electrode to said first capacitor electrode being formed of the same material as said pixel electrode.

14. A flat panel display device, comprising:
a substrate;
a first transistor, comprising:
  a first gate electrode formed on said substrate;
  a first drain electrode insulated from said first gate electrode;
  a first source electrode insulated from said first gate electrode and surrounding said first drain electrode in the same plane; and
  a first semiconductor layer disposed below and electrically contacting said first drain electrode and said first source electrode, and insulated from said first gate electrode;
a second transistor, comprising:
  a second gate electrode;
  a second drain electrode insulated from said second gate electrode;
  a second source electrode insulated from said second gate electrode and surrounding said second drain electrode; and
  said semiconductor layer insulated from said second gate electrode and contacting said second drain electrode and said second source electrode;
a gate insulating layer formed on said entire surface of said substrate and covering said first gate electrode and said second gate electrode;
a protective layer formed on the entire surface of said substrate and covering said first drain electrode and said first source electrode, said second drain electrode and said second source electrode, and said semiconductor layer;
a first contact hole formed in said protective layer and said semiconductor layer to expose a portion of said second drain electrode;
a second contact hole formed in said protective layer, said semiconductor layer, and said gate insulating layer correspond to a region other than the region between said first drain and source electrodes to expose a portion of said first gate electrode, with said second drain electrode and said first gate electrode being electrically connected to each other by an interconnection formed in said first contact hole and said second contact hole and on said protective layer; and
a display element including a pixel electrode electrically connected to said first electrode.

15. The flat panel display device of claim 14, wherein said third electrode and said fourth electrode are both disposed above said second gate electrode.

16. The flat panel display device of claim 14, wherein said second gate electrode is disposed above or below a space between said electrode and said fourth electrode.

17. A flat panel display device, comprising:
a substrate;
a first transistor, comprising:
  a first gate electrode formed on said substrate;
  a first drain electrode insulated from said first gate electrode;
  a first source electrode insulated from said first gate electrode and surrounding said first drain electrode in the same plane; and
  a first semiconductor layer disposed below and electrically contacting said first drain electrode and said first source electrode, and insulated from said first gate electrode;
a second transistor, comprising:
  a second gate electrode;
  a second source electrode insulated from said second gate electrode;
  a second drain electrode insulated from said second gate electrode and surrounding said second source electrode;
  said semiconductor layer insulated from said second gate electrode and contacting said second drain electrode and said second source electrode;
a gate insulating layer formed on said entire surface of said substrate and covering said first gate electrode and said second gate electrode;
a protective layer formed on the entire surface of said substrate and covering said first drain electrode and said first source electrode, said second drain electrode and said second source electrode, and said semiconductor layer;
a first contact hole formed in said protective layer and said semiconductor layer to expose a portion of said second drain electrode;
a second contact hole formed in said protective layer, said semiconductor layer, and said gate insulating layer correspond to a region other than the region between said first drain and source electrodes to expose a portion of said first gate electrode, with said second drain electrode and said first gate electrode being electrically connected to each other by an interconnection formed in said first contact hole and said second contact hole and on said protective layer; and
a display element including a pixel electrode electrically connected to said first electrode.

* * * * *